United States Patent
Gerald, II et al.

(10) Patent No.: US 7,271,592 B1
(45) Date of Patent: Sep. 18, 2007

(54) TOROID CAVITY/COIL NMR MULTI-DETECTOR

(75) Inventors: Rex E. Gerald, II, Brookfield, IL (US); Alexander D. Meadows, Indianapolis, IN (US); Joseph S. Gregar, Naperville, IL (US); Jerome W. Rathke, Homer Glen, IL (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 11/152,853

(22) Filed: Jun. 14, 2005

Related U.S. Application Data

(60) Provisional application No. 60/579,428, filed on Jun. 14, 2004.

(51) Int. Cl.
*G01V 3/00* (2006.01)

(52) U.S. Cl. ...................... 324/321; 324/318
(58) Field of Classification Search ............ None
See application file for complete search history.

(56) References Cited

U.S. PATENT DOCUMENTS

| | | | | |
|---|---|---|---|---|
| 6,097,188 A * | 8/2000 | Sweedler et al. | ........... | 324/321 |
| 6,498,487 B1 * | 12/2002 | Haner | ........................ | 324/318 |
| 6,674,285 B2 * | 1/2004 | Haner | ........................ | 324/318 |
| 6,696,838 B2 * | 2/2004 | Raftery et al. | ............... | 324/321 |
| 6,822,454 B2 * | 11/2004 | Peck et al. | ................... | 324/321 |
| 6,958,609 B2 * | 10/2005 | Raftery et al. | .............. | 324/321 |
| 2002/0149369 A1 * | 10/2002 | Peck et al. | ................... | 324/321 |
| 2003/0048103 A1 * | 3/2003 | Haner | ........................ | 324/322 |
| 2005/0030033 A1 * | 2/2005 | Peck et al. | ................... | 324/321 |
| 2005/0253587 A1 * | 11/2005 | Peck et al. | ................... | 324/321 |

* cited by examiner

*Primary Examiner*—Brij Shrivastav
*Assistant Examiner*—Tiffany A. Fetzner
(74) *Attorney, Agent, or Firm*—Mark LaMarre; Mark P. Dvorscak; Paul A. Gottlieb

(57) ABSTRACT

An analytical device for rapid, non-invasive nuclear magnetic resonance (NMR) spectroscopy of multiple samples using a single spectrometer is provided. A modified toroid cavity/coil detector (TCD), and methods for conducting the simultaneous acquisition of NMR data for multiple samples including a protocol for testing NMR multi-detectors are provided. One embodiment includes a plurality of LC resonant circuits including spatially separated toroid coil inductors, each toroid coil inductor enveloping its corresponding sample volume, and tuned to resonate at a predefined frequency using a variable capacitor. The toroid coil is formed into a loop, where both ends of the toroid coil are brought into coincidence. Another embodiment includes multiple micro Helmholtz coils arranged on a circular perimeter concentric with a central conductor of the toroid cavity.

3 Claims, 17 Drawing Sheets

TOROID COIL NMR MULTI-DETECTOR

TOROID COIL MULTI-DETECTOR SAMPLE TUBE

SCHEMATIC DRAWING OF A TOROID COIL MULTI-DETECTOR SAMPLE TUBE

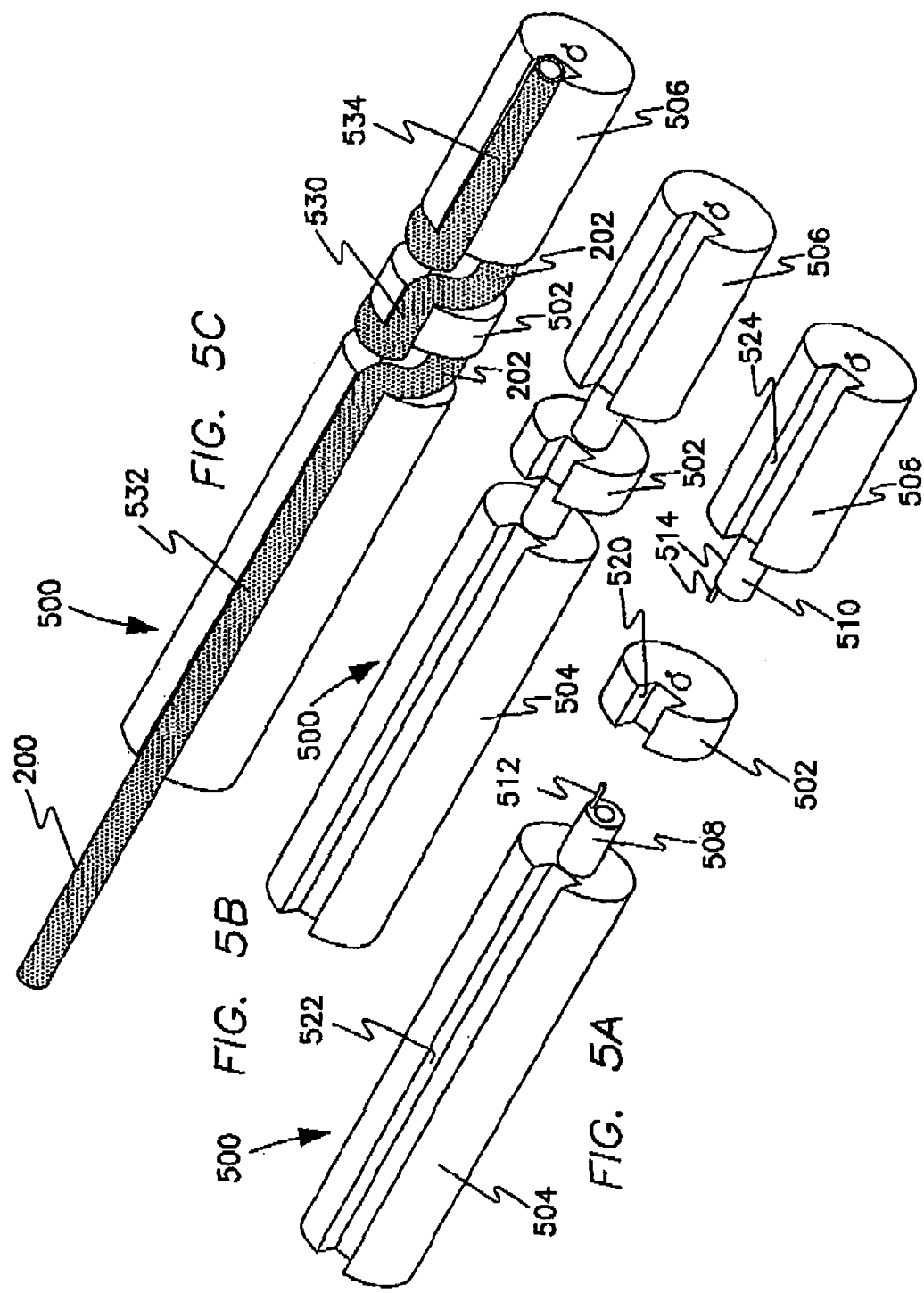

TWO-LOOP GLASS TUBE MULTI-DETECTOR NMR PROBE

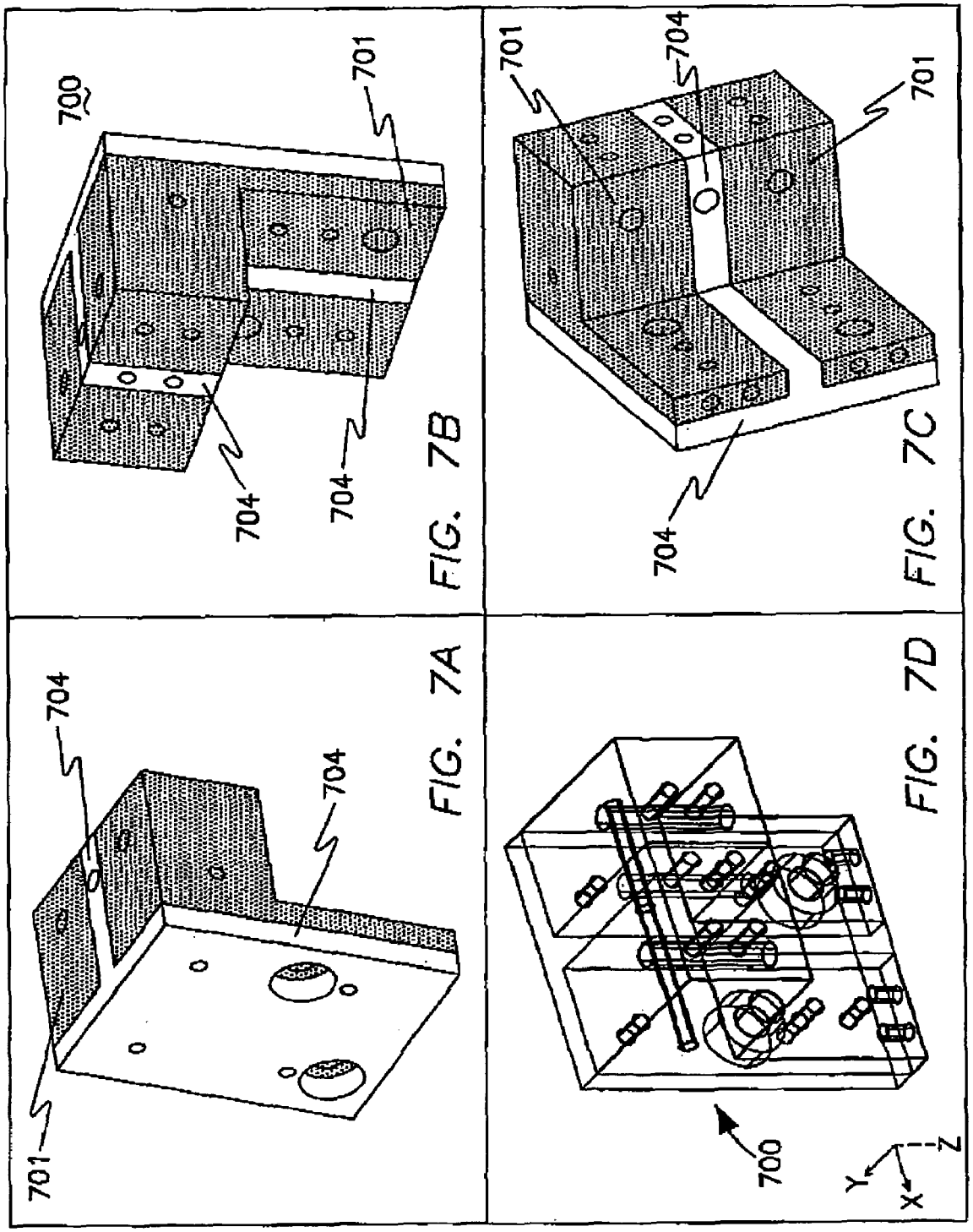

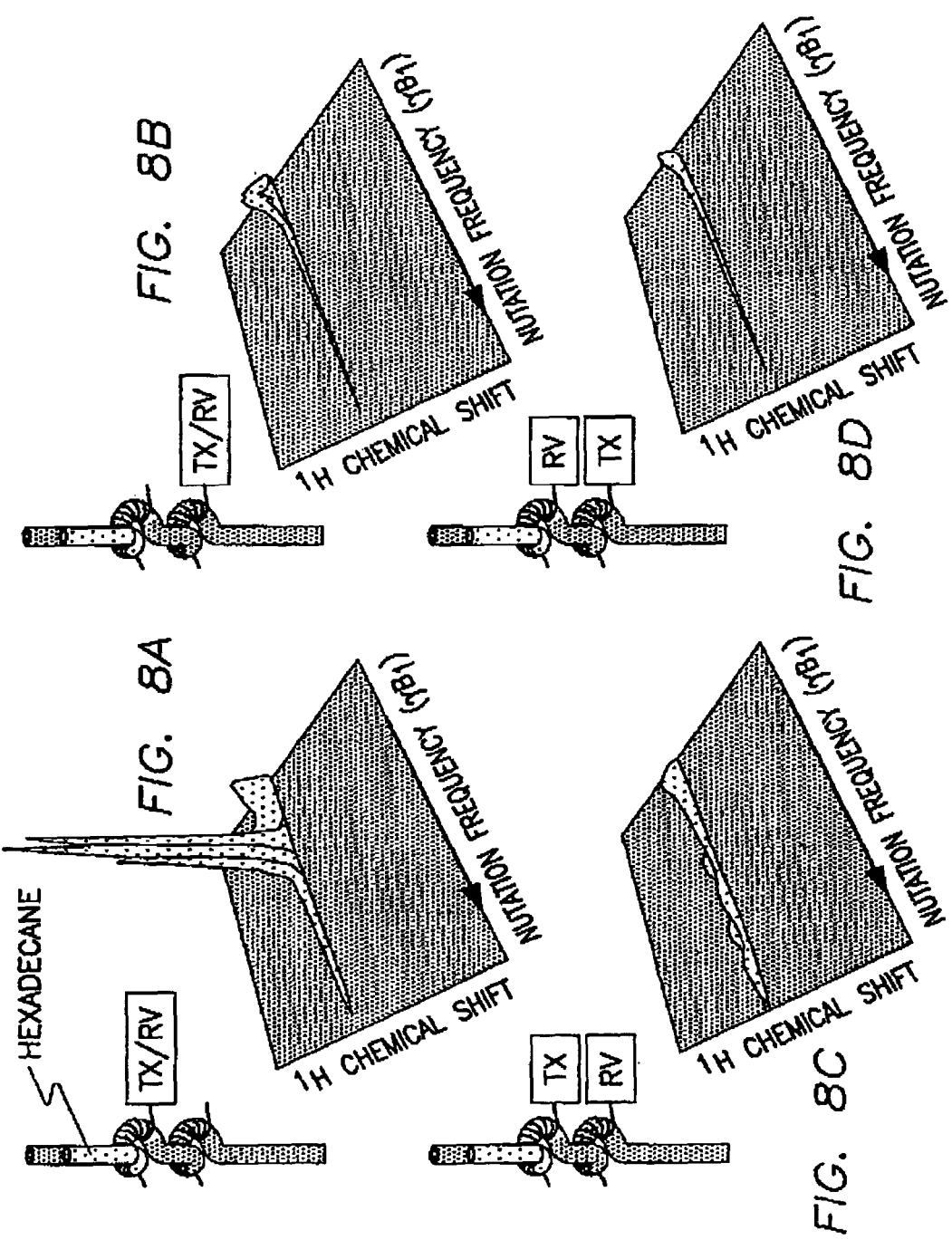

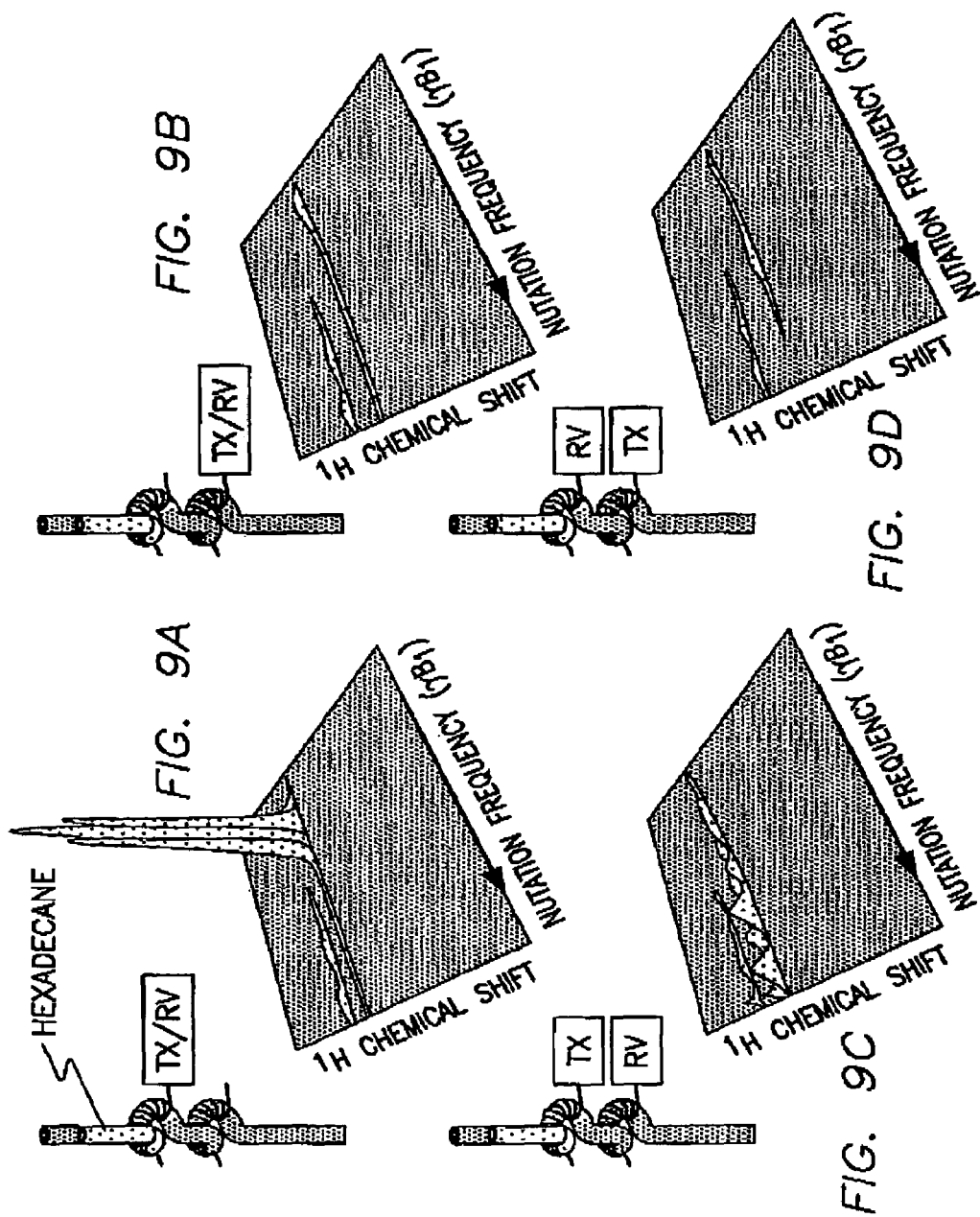

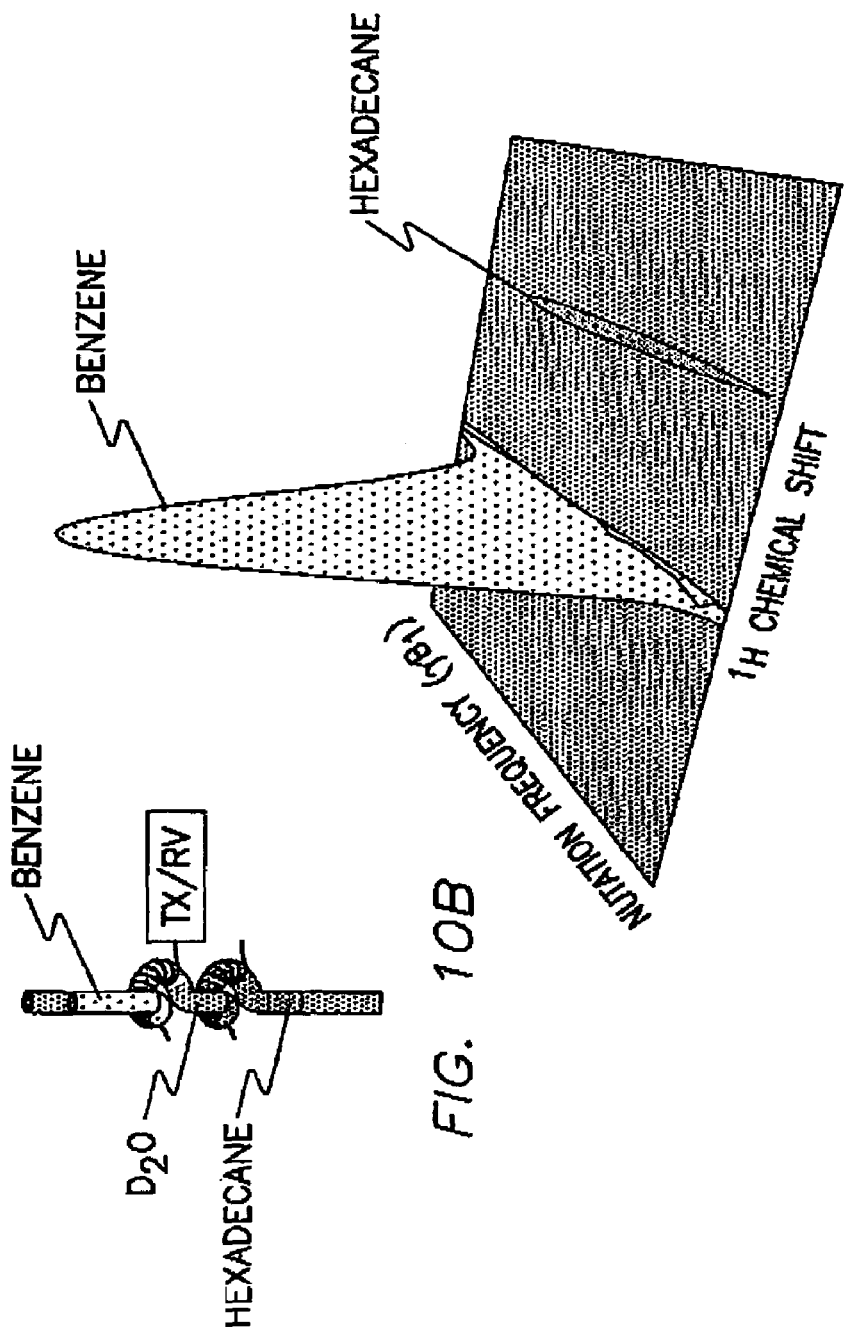

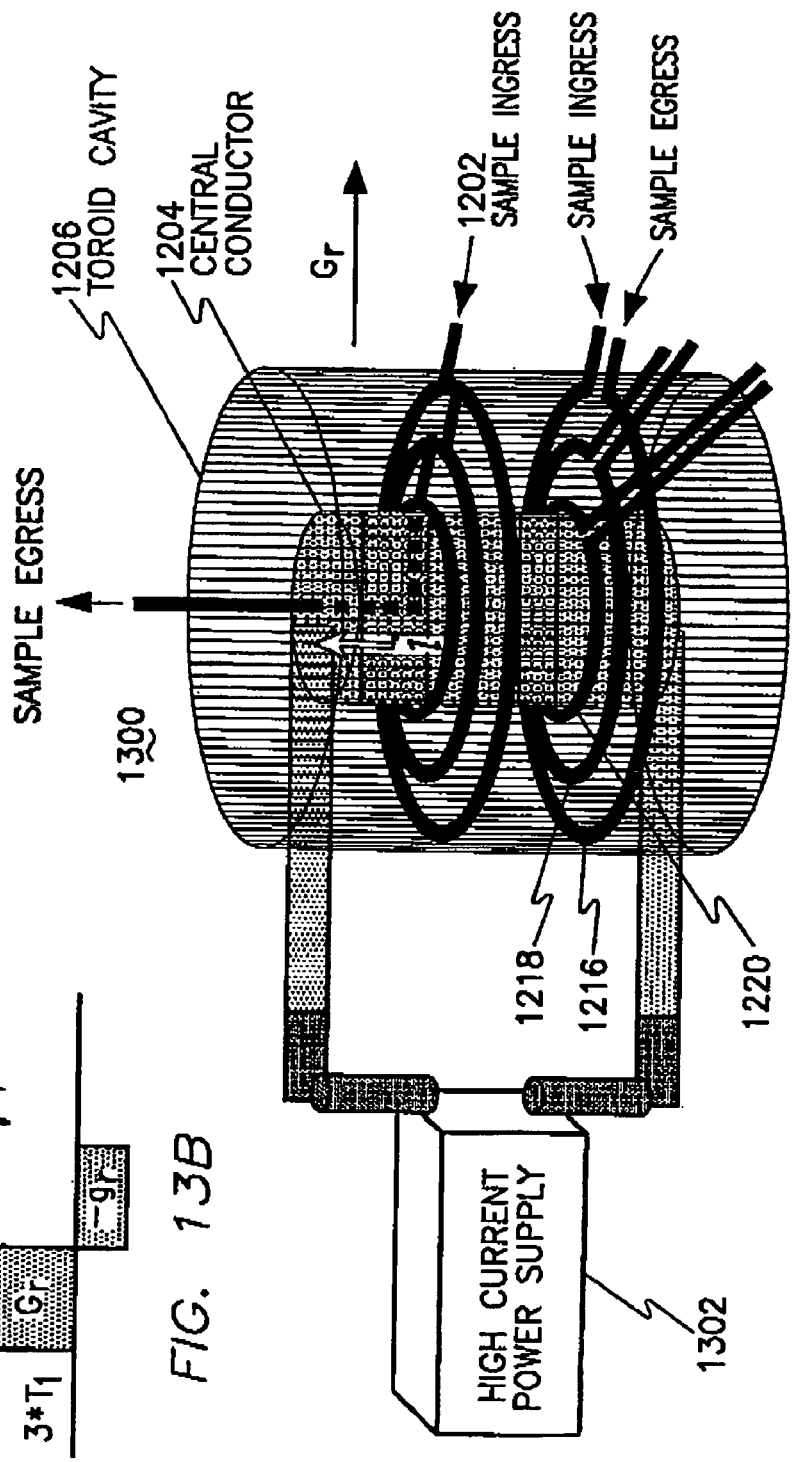
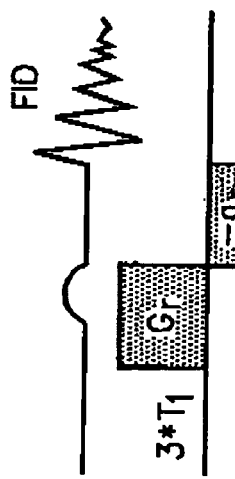
FIG. 13A
FIG. 13B
TOROID CAVITY NMR MULTI-DETECTOR
RADIAL $B_0$ GRADIENT

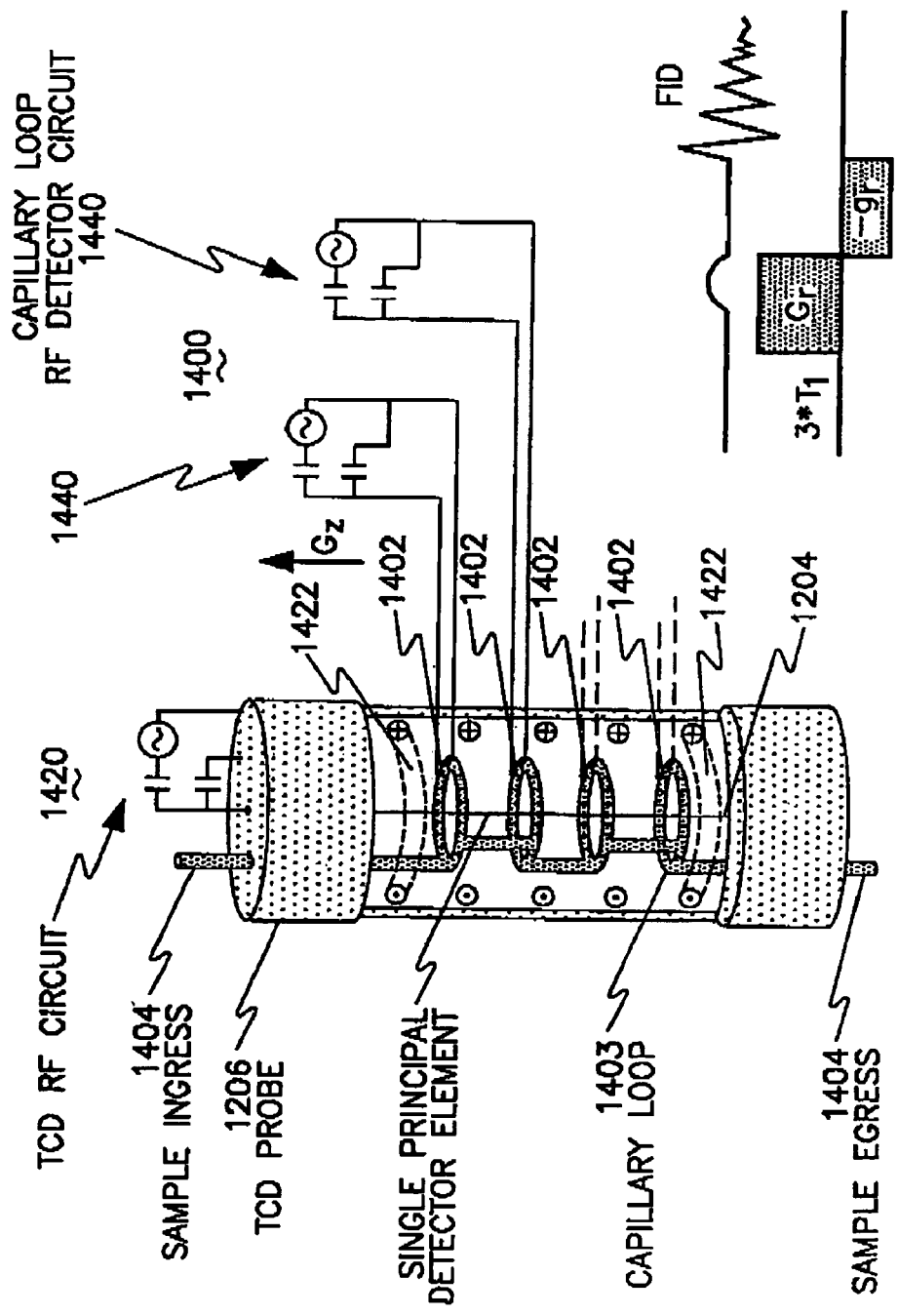

TOROID CAVITY/COIL NMR MULTI-DETECTOR

PRIORITY

This application claims priority from Provisional Application No. 60/579,428 filed on Jun. 14, 2004. This application was filed during the term of the before-mentioned Provisional Application

CONTRACTUAL ORIGIN OF THE INVENTION

The United States Government has rights in this invention pursuant to Contract No. W-31-109-ENG-38 between the United States Government and Argonne National Laboratory.

FIELD OF THE INVENTION

The present invention relates to an analytical device for rapid, non-invasive nuclear magnetic resonance (NMR) spectroscopy of multiple samples using a single spectrometer, and more particularly to a modified toroid cavity/coil detector (TCD), and methods for conducting the simultaneous acquisition of NMR data for multiple samples including a protocol for testing NMR multi-detectors.

DESCRIPTION OF THE RELATED ART

Spectroscopic tools such as NMR, Fourier Transform InfraRed spectroscopy (FTIR), Electron Paramagnetic Resonance spectroscopy (EPR), and UltraViolet/VISible spectroscopy (UVNIS) provide insight into the atomic connectivities, architecture, dynamics, and electronic multiplicity in molecules. The data that these tools generate are presented in the form of spectrographs, which are signatures of the electronic structure that bind atoms together to form molecules. Spectrographs are interpreted by comparison to standards, theoretical calculations, and simulations to reveal or corroborate atomic structure in molecules. Spectroscopic tools operate at a molecular level to analyze bulk materials that are typically in an isotropic powder or liquid, and perform the analyses one sample at a time, in a serial manner.

Combinatorial chemistry research using NMR spectroscopy has spurred the demand for detectors and methods for independently analyzing multiple samples in parallel using hardware typically employed for serial sample analyses. Known multi-sample NMR probes and associated analytical methodologies for high sample throughput employ solenoid RF coils. An inherent drawback of using solenoid coils is the dipolar fringe field that they produce. A pair of solenoid coils that are electrically uncoupled may nonetheless interfere with one another, producing contaminated NMR spectra. The mechanism for the deleterious cross talk signal is described by the spatial disposition of each coil within the fringe field of the other coil. The small volume of space available in the superconducting magnet of an NMR spectrometer requires that the coils of a multi-detector be arranged in close proximity to one another. One method used to mitigate the fringe-field problem is to incorporate grounded, metallic shields between coils. The metal shields, however, reduce the quality factor of the resonant circuit and spoil the high homogeneity of the static magnetic field in the volume within the coil detectors, thus diminishing the resolution and sensitivity of the NMR probe. Another probe design employed to reduce cross talk was based on the miniaturization of the detector coils, however, a concomitant and unavoidable decrease in overall probe sensitivity for dilute analytes resulted.

Nuclear magnetic resonance (NMR) analysis is a powerful method by which to determine chemical structures and to examine reaction dynamics in a diversity of chemical and biochemical systems.

For example, U.S. Pat. No. 5,574,370, issued Nov. 12, 1996 to Woelk et al., discloses a toroid cavity detection (TCD) system for determining the spectral properties and distance from a fixed point for a sample using Nuclear Magnetic Resonance. The detection system consists of a toroid with a central conductor oriented along the main axis of the toroidal cylinder and parallel to a static uniform magnetic field, $B_0$. An RF signal is inputted to the central conductor to produce a magnetic field $B_1$ perpendicular to the central axis of the toroid and whose field strength varies as the inverse of the radial position within the toroid. The toroid cavity detection system can be used to encapsulate a sample, or the detection system can be perforated to allow a sample to flow into the detection device or to place the samples in specified sample tubes. The central conductor can also be coated to determine the spectral properties of the coating and the coating thickness. The sample is then subjected to the respective magnetic fields and the responses measured to determine the desired properties.

U.S. Pat. No. 6,046,592, issued Apr. 4, 2000 to Rathke et al., discloses a near-electrode imager for employing nuclear magnetic resonance imaging to provide in situ measurements of electrochemical properties of a sample as a function of distance from a working electrode. The near-electrode imager uses the radio frequency (RF) field gradient within a cylindrical toroid cavity resonator to provide high-resolution nuclear magnetic resonance spectral information on electrolyte materials.

U.S. Pat. No. 6,191,583, issued Feb. 20, 2001 to Gerald II, discloses a toroid cavity detector that includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity. The field $B_1$ is oriented perpendicular to the field $B_0$. Following the RF current pulse, the response of the sample to the applied field $B_0$ is detected and analyzed. In order to minimize the detrimental effect of probe ringing, the cylindrically shaped housing is elongated sufficiently in length so that the top and bottom portions are located in weaker, fringe areas of the static main magnetic field $B_0$. In addition, a material that tends to lessen the effect of probe ringing is positioned along the top and bottom ends of the toroid cavity. In another embodiment, a plug is positioned adjacent the inside of the top and bottom ends of the toroid cavity so that the sample contained in the toroid cavity is maintained in the strongest and most homogeneous region of the static magnetic field $B_0$.

U.S. Pat. No. 6,538,444, issued Mar. 25, 2003 to Gerald II et al., discloses a two dimensional $B_1$-gradient NMR imager and methods for non-invasive spectroscopic investigations and imaging of the internal distribution and speciation of materials of fluid, solid, and semisolid objects in two spatial dimensions utilizing a toroid cavity detector. An RF signal transmitter/receiver generates a magnetic field $B_1$ within the toroid cavity and receives a sample response to the magnetic fields $B_0$ and $B_1$. A pivot angle position controller adjusts a pivot angle position of the toroid cavity and enclosed sample to vary an angle between the magnetic field $B_0$ and the central axis of the toroid cavity. A positional rotation controller positions the toroid cavity and enclosed sample at variable angular orientations relative to an initial position and a plane formed by the externally applied static main magnetic field $B_0$ and the central axis of the toroid cavity. A computer sequentially receives and processes sample responses to produce a two-dimensional image.

U.S. Pat. No. 6,720,769, issued Apr. 13, 2004 to Gerald II et al., discloses a detecting method and detector that expands the capabilities of Nuclear Magnetic Resonance (NMR) analysis. A Rotational Exchange Gradient Imager (REGI) allows for real-time, in situ investigation of materials subjected to the effects of centrifugal force by NMR analysis. The REGI comprises a cylindrical stator formed of an electrically conductive, non-magnetic material, a rotor contained in the cylindrical stator formed of an electrically non-conductive, non-magnetic material, and a conductor located along a central axis of the cylindrical stator. A sample is contained within the rotor. The stator and central conductor serve to generate the RF magnetic field for NMR analysis. The rotor containing the sample is rotated within a stable air bearing formed between the cylindrical stator and rotor.

The subject matter of each of the U.S. Pat. Nos. 5,574,370, 6,046,592, 6,191,583, 6,538,444, and 6,720,769 is incorporated herein by reference.

A principal object of the present invention is to provide an improved analytical device for rapid, non-invasive nuclear magnetic resonance (NMR) spectroscopy of multiple samples using a single spectrometer.

It is another object of the present invention to provide methods for conducting the simultaneous acquisition of NMR data for multiple samples including a protocol for testing NMR multi-detectors.

SUMMARY OF THE INVENTION

In brief, an analytical device for rapid, non-invasive nuclear magnetic resonance (NMR) spectroscopy of multiple samples using a single spectrometer is provided. A modified toroid cavity/coil detector (TCD), and methods for conducting the simultaneous acquisition of NMR data for multiple samples including a protocol for testing NMR multi-detectors are provided. The toroid coil is a solenoid coil formed into a loop, where both ends of the solenoid coil are brought into coincidence. The fringe field vanishes, because a toroid coil completely contains the magnetic field it generates. An additional significant attribute of the toroid coil geometry is the substantial elimination of poor magnetic field homogeneity and the resulting spread in the linewidth of NMR resonances and a concomitant reduction in the signal intensity as compared with a conventional solenoid coil because the toroid coil closes in on itself. The wire conductor is wrapped around the sample tube loop to form a toroid coil which can function alternately as a RF magnetic field generator for interrogation of a sample and for receiving an NMR signal from the sample. In some embodiments, this dual function of the toroid coil eliminates the need for a central conductor and toroid cavity for the generation of a RF magnetic field.

One embodiment of the Toroid Cavity/Coil NMR Multi-detector includes a plurality of LC resonant circuits including spatially separated toroid coil inductors (L), each toroid coil inductor (L) enveloping its corresponding sample volume, and tuned to resonate at 300 MHz using a variable capacitor (C). A sample container is a glass tube formed into a plural loop helix with a minimum pitch. About each glass loop, the toroid coil inductor is wound using an electrically conductive wire, such as a copper wire. A fixed nonmagnetic ceramic capacitor is used to couple each coil to an output of a RF transmitter.

Another embodiment of the Toroid Cavity/Coil NMR Multi-detector includes a toroid cavity detector that contains multiple micro Helmholtz coils arranged on a circular perimeter concentric with the central conductor of the toroid cavity. The angular orientation of each Helmholtz coil is adjusted to minimize magnetic field coupling to the TCD. The TCD and a plurality of Helmholtz coil resonant circuits are tuned to an identical Larmor frequency for the nuclear spin under test. Simultaneous excitation by the toroid cavity is provided to all samples located in capillary tubes within the Helmholtz coils that surround the central conductor. Following an RF excitation pulse, the individual micro Helmholtz coils are used to detect the low-power NMR signals.

The individual NMR signals are amplified and then multiplexed to the spectrometer receiver. A high-speed digitizer on the spectrometer is used in the over-sampling mode to sequentially record the NMR signals from the individual Helmholtz coils such that the discreet voltage measurements of n free induction decays (FIDs) from n detector coils are interleaved. Straightforward manipulation of the interleaved data points results in n independent FIDs, which are subsequently Fourier transformed to n NMR spectra.

A protocol for testing multi-detector NMR probes including n coils includes the steps of collecting a nutation image that is a volume-weighted map of the magnitude of the RF magnetic field over the entire sample volume for every permutation of a transmitter (TR) coupling or sample excitation, receiver (RV) coupling or signal reception, and all n coils. Using a numeral subscript to designate a coil, then the series for the test protocol can be represented by:

$TR_1RV_1$, $TR_1RV_2$, . . . $TR_1RV_n$, $TR_2RV_1$, $TR_2RV_2$, $TR_2RV_n$, . . . $TR_nRV_n$. Nutation images are recorded using this probe connection protocol. For each combination of transmitter and receiver connections to the multi detector probe in the series, a sequence of NMR spectra are recorded, which constitutes one image. The method for recording such an image is known as the rotating frame image (RFI) method.

BRIEF DESCRIPTION OF THE DRAWINGS

The present invention together with the above and other objects and advantages may best be understood from the following detailed description of the preferred embodiments of the invention illustrated in the drawings, wherein:

FIG. 4 illustrates exemplary two-loop glass tube multi-detector design showing spatial disposition of two toroid coils for use with the toroid NMR multi-detector of FIG. 1 of the preferred embodiment;

FIGS. 5A, 5B, and 5C illustrate a jig for fabrication of the two-loop glass tube multi-detector of FIG. 4 of the preferred embodiment;

FIGS. 7A, 7B, 7C, and 7D illustrate an exemplary capacitor coupler for a two-loop glass tube multi-detector NMR probe for use with the toroid NMR multi-detector of FIG. 4 of the preferred embodiment;

FIGS. 8A, 8B, 8C, and 8D illustrate rotating frame image experiments conducted using a top coil for RF transmission (TX) and NMR signal reception (RV) with a bottom coil in close proximity, with the sample tube prepared with hexadecane in the top loop in the toroid NMR multi-detector of FIG. 4 of the preferred embodiment;

FIGS. 9A, 9B, 9C, and 9D are similar to the illustrated images of FIGS. 8A, 8B, 8C, and 8D, respectively after being reprocessed using a vertical scaling correction ($F^2$);

FIGS. 10a and 10b illustrates a further image experiment where a vertical axis was scaled by $F^2$ in the toroid NMR multi-detector of FIG. 4 of the preferred embodiment as setup to analyze benzene in an upper detector in the presence of hexane in a lower detector;

FIGS. 13A and 13B together illustrate a fourth embodiment of a multi-detector NMR probe based on a toroid detector of the preferred embodiment illustrating concentric sample tube providing for continuous flow through multiple interconnected concentric rings or concentric rings having independent ingress and egress, in a radial magnetic field gradient $G_r$ through application of a current in a central conductor utilizing a high current power supply;

FIGS. 14A, 14B, and 14C together illustrates a fifth embodiment of a multi-detector NMR probe based on a toroid cavity detector including individual toroid coil detectors located concentric with the central conductor of a TCD of the preferred embodiment, showing continuous multiple sample feed (A) or discrete sample feed through separate toroid coils (B) and showing gradient coil for generating a static axial magnetic field gradient $G_z$ generated by RF and gradient pulse sequence (C)

DETAILED DESCRIPTION OF THE PREFERRED EMBODIMENTS

In accordance with features of the invention, an analytical device is provided for rapid, non-invasive nuclear magnetic resonance (NMR) spectroscopy of multiple samples using a single spectrometer. The problem of the radio frequency (RF) magnetic fringe fields produced by the multiple coils employed for NMR detection is directly addressed.

In accordance with features of the invention, a modified toroid cavity/coil detector (TCD), and methods for conducting the simultaneous acquisition of NMR data for multiple samples including a protocol for testing NMR multi-detectors are provided. The toroid coil is a solenoid coil formed into a loop or donut, where both ends of the solenoid coil are brought into coincidence. The radio frequency (RF) magnetic fringe field vanishes, because a toroid coil completely contains the magnetic field it generates. An associated problem with solenoid coils is the poor magnetic field homogeneity at the coil ends, which results from mismatched susceptibilities and discontinuities in materials. Static magnetic field inhomogeneity causes a spread in the linewidth of NMR resonances, and a concomitant reduction in the signal intensity. An additional significant attribute of the toroid coil geometry is the elimination of these deleterious effects on the homogeneity of the static applied magnetic field by the open ends of a solenoid coil because the toroid coil closes in on itself.

In accordance with features of the invention, a protocol that was developed for testing multi-detector NMR probes composed of n coils consists of collecting a nutation image (a volume-weighted map of the magnitude of the RF magnetic field over the entire sample volume) for every permutation of transmitter (TR) coupling (sample excitation), receiver (RV) coupling (signal reception), and all n coils. If a numeral subscript is used to designate a coil, then the series for the test protocol is: $TR_1RV_1$, $TR_1RV_2$, . . . $TR_1RV_n$, $TR_2RV_1$, $TR_2RV_2$, $TR_2RV_n$, . . . $TR_nRV_n$. Nutation images (also know as rotating frame images) were recorded using the first embodiment of the present invention following this protocol.

Figure 1:
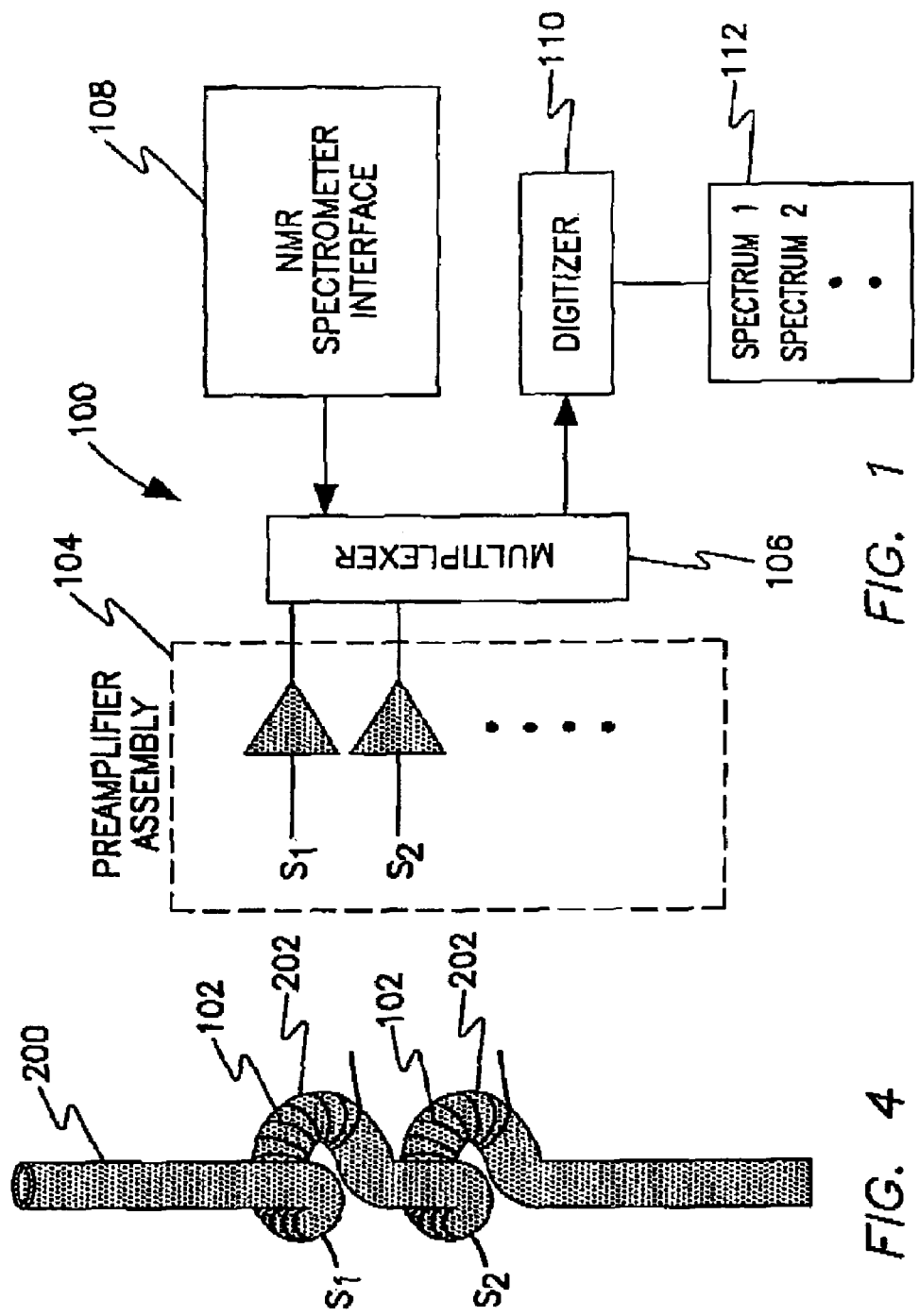
FIG. 1 (together with FIG. 4) is a schematic and block diagram of a toroid NMR multi-detector of the preferred embodiment (in practice the device of FIG. 1 functions in conjunction with the device of FIG. 4)

Having reference now to the drawings, FIGS. 1 and 4 illustrate a NMR multi-detector of the preferred embodiment generally designated by the reference character 100 employing a plurality of toroid coils 102 coupled by a preamplifier assembly 104 to a signal multiplexer 106. An NMR spectrometer interface 108 and a digitizer 110 are coupled to the signal multiplexer 106. A spectrum 1-n, 112 or experiment image is generated corresponding to each preamplified signal S1-Sn input to the signal multiplexer 106. The illustrated example NMR multi-detector 100 includes a two-detector NMR probe.

Figure 2:
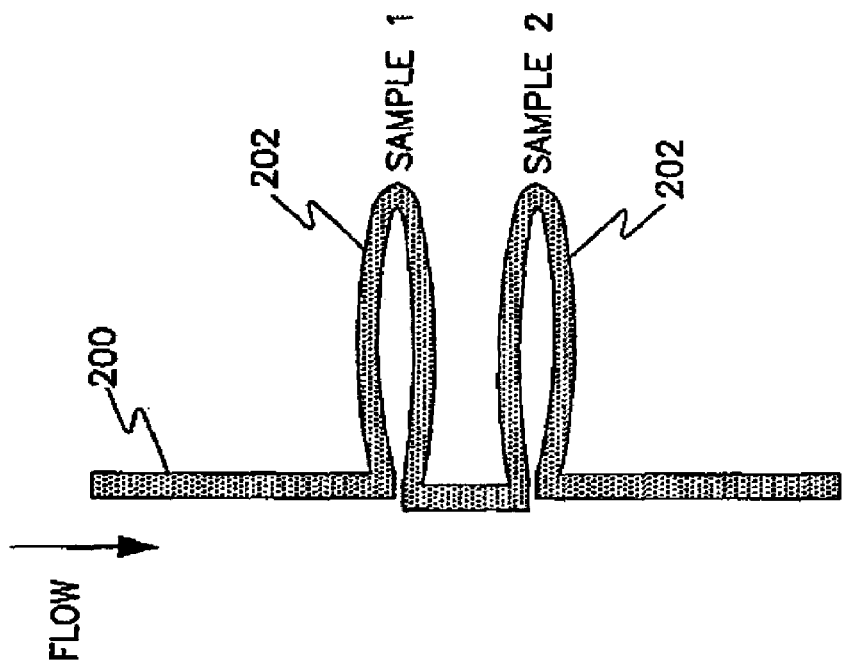
FIG. 2 is a schematic diagram not to scale illustrating geometry of the two-loop glass tube used to contain two samples for simultaneous NMR analyses by two toroid coils for use with the toroid NMR multi-detector of FIG. 1 of the preferred embodiment.

In FIG. 2 there is shown a glass tube generally designated by the reference character 200 including two loops 202. The two-loop glass tube 200 is used to contain two samples for simultaneous NMR analyses by two associated toroid coils 102 respectively carried by the loop 202, as shown in FIG. 4.

Figure 3:
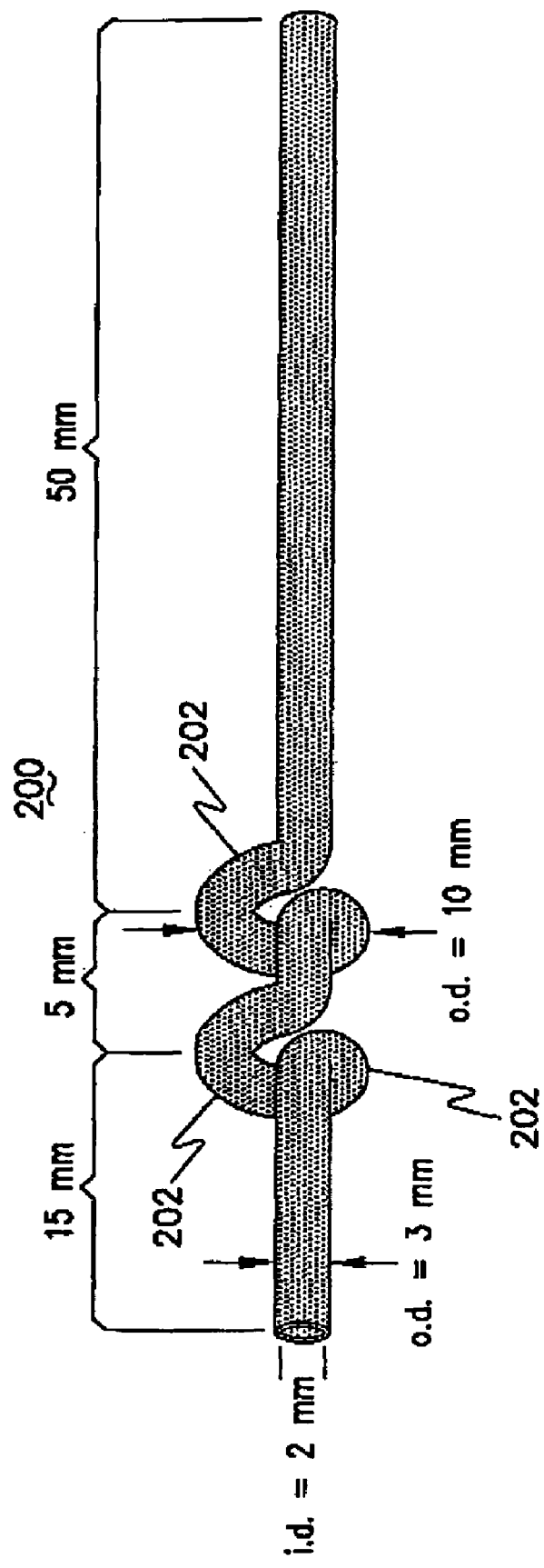
FIG. 3 is a diagram providing exemplary dimension specifications for the two-loop glass tube multi-detector design of the preferred embodiment.

FIG. 3 provides exemplary dimension specifications for a prototype of the two-loop glass tube 200 of the NMR multi-detector 100.

FIG. 4 illustrates the two-loop glass tube 200 of the multi-detector 100 showing spatial disposition of two toroid coils 102, each respectively carried by respective loops 202 in the glass tube 200. The conductive material from which the toroid coils 102 is formed functions alternately as a RF magnetic field generator for interrogation of a sample and as a detector for receiving an NMR signal from the sample. This dual functionality of the toroid coil eliminates the necessity for a central conductor for the generation of a RF magnetic field. However, the inclusion of a central conductor and toroid cavity provides features including a magnetic field lock that maintains a fixed magnitude magnetic field that is useful for NMR analyses of samples conducted over long periods of time.

In accordance with features of the invention, an embodiment of the Toroid Cavity/Coil NMR Multi-detector 100 has been designed, fabricated, and tested, for example, as illustrated and described with respect to FIGS. 1 and 4. The Toroid Cavity/Coil NMR Multi-detector 100 includes two LC resonant circuits employing two spatially separated toroid coil inductors (L) 102, each enveloping its corresponding sample volume within loop 202, and tuned to resonate at 300 MHz using a variable capacitor (C), for example, as illustrated and described with respect to FIGS. 6A and 6B. A glass tube 200 formed into a two-loop helix with a minimum pitch defines each respective sample container 202. About each glass loop 202, a 15-turn toroid coil inductor 102 was wound using 26 gauge copper wire. A fixed 0.5 pF nonmagnetic ceramic capacitor was used to couple each coil to the 50Ω output of a RF transmitter. Each coil was tuned to a nominal resonance frequency of 300 MHz using a variable 0.4-3.5 pF nonmagnetic capacitor connected in parallel to the toroid coil. The device was successfully used to selectively obtain proton NMR spectra of liquid samples in each of the glass loops in a static magnetic field of 7.05 T.

FIGS. 5A, 5B, and 5C illustrate a jig generally designated by reference character 500 for fabrication of the two-loop glass tube 200 of the NMR multi-detector 100. As shown in exploded view of FIG. 5A, the glass-tube fabrication jig 500 includes three sections including a central jig section 502, and a pair of opposite end jig sections 504, and 506. Each of the opposite end jig sections 504, and 506 include smaller-diameter elongated portions 508, 510 carrying keying features 512, 514 for positioning and alignment for mating engagement with the central jig section 502. Each of the central jig section 502, and the opposite end jig sections 504, and 506 respectively includes a respective aligned slot 520, 522, 524. The respective aligned slots 520, 522, 524 receive a corresponding aligned straight portions 530, 532, 534 of the glass tube 200 as shown in the assembled view of FIG. 5C with the glass-tube fabrication jig 500 forming the two-loop glass tube 200. The loops 202 in the two-loop glass tube 200 are defined on the smaller-diameter elongated portions 508, 510 of the opposite end jig sections 504, and 506.

Figure 6B:
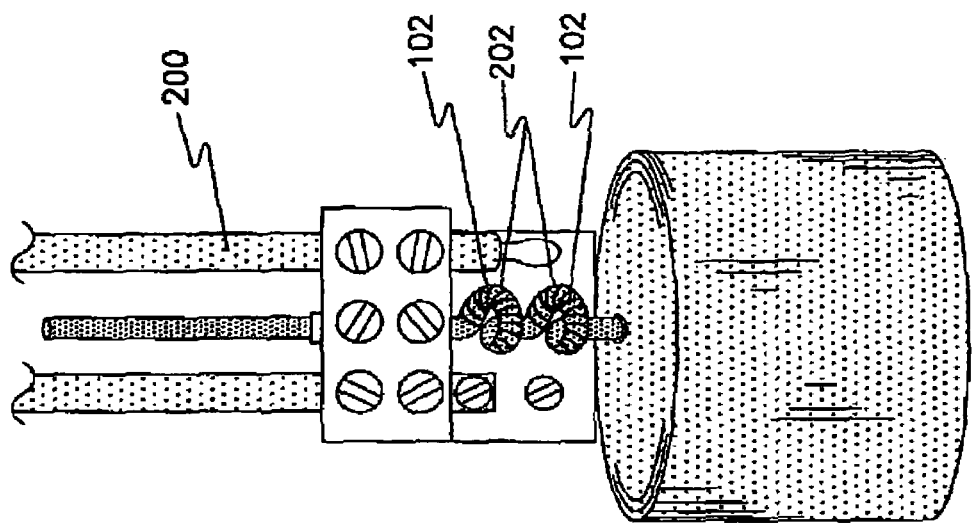
FIGS. 6A and 6B illustrate an exemplary two-loop glass tube multi-detector NMR probe with respective left and right RF connectors coupled to the top and bottom coils, respectively for use with the toroid NMR multi-detector of FIGS. 1 and 4 of the preferred embodiment.
Figure 6A:
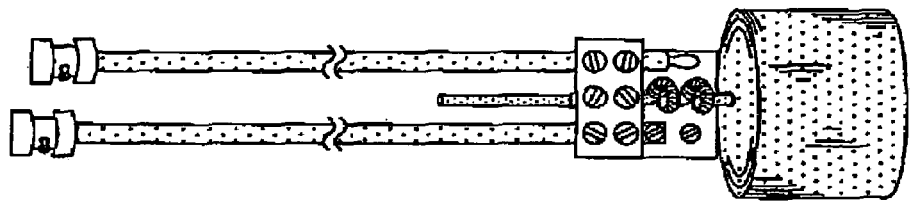

FIGS. 6A and 6B are photographs of a prototype two-loop glass tube 200 with loops 202 supporting associated inductors 102 defining multi-detector NMR probe. The left and right RF connectors are coupled to the top and bottom coils 102, respectively.

FIGS. 7A, 7B, 7C, and 7D illustrate an exemplary capacitor coupler for a two-loop glass tube multi-detector NMR probe generally designated by the reference character 700 for use with the toroid NMR multi-detector 100 of the preferred embodiment. A part of a pair of RF tuned circuits 701 share a common ground in the original design of the capacitor coupler, which was fabricated from a single copper block 602 in FIGS. 6A and 6B. The newly designed capacitor coupler 700 uses an integrated Teflon insulator 704 to electrically separate the two parts of two RF circuits 701. Uncoupling the two capacitor couplers from one another will reduce the cross talk between the RF circuits.

FIGS. 8A, 8B, 8C, and 8D illustrate image experiments conducted using one toroid coil 102 for RF transmission (TX) and NMR signal reception (RV) (FIGS. 8A and 8B) or alternatively with one toroid coil 102 for each of RF transmission (TX) and NMR signal reception (RV) (FIGS. 8C and 8D) with the sample tube prepared with hexadecane in the top loop 202 in the toroid NMR multi-detector 100 of FIGS. 1 and 4 of the preferred embodiment. The sample tube 200 was prepared with hexadecane in the top loop 202, as shown in FIG. 8A. Rotating frame image (RFI) experiments were conducted using the top coil for RF transmission (TX) and NMR signal reception (RV) as shown in FIG. 8A with the bottom coil terminated into 50 Ohms. Both coils were optimized for 300 MHz prior to placing the probe in the magnet. Image data shows a strong signal from the top coil 102 primarily at higher nutation frequency. Pulse width increment was 2.5 μs. The images of FIGS. 8A, 8B, 8C, and 8D were processed without using nutation frequency squared ($F^2$) correction for the image vertical intensity scale, and therefore show the observed/detected signal (raw data). Note the weaker, but considerable amount of signal at lower nutation frequencies. In FIG. 8B, the bottom coil was connected to the spectrometer as a standard probe (i.e., TR/RV on the same cable). The probe was previously tuned, but the tuning may have changed once the probe was positioned in the magnet. The proton spectra for the empty coil appeared weaker than the signals observed with the filled coil, but weaker by only a factor of 3-4, and certainly not weaker by the amount suggested by the images. Note that for the empty coil, only a signal at low nutation frequencies was observed, the signal at high nutation frequencies is completely absent. This result is self consistent. The signal obtained by the empty coil is detectible, but is quite weak, as demonstrated by both the signal intensity and the low nutation frequencies. The empty coil is eliciting a response from the sample in the filled coil, but the strength of the $B_1$ field used to excite and detect the sample in the filled coil is very weak at the location of the filled coil. This signal is a measure of the cross talk effect that occurs between two circuits that are tuned to the same frequency and have overlapping $B_1$ fields. The image in FIG. 8C, was recorded with the transmitter connected to the filled coil and the receiver connected to the empty coil. The idea was to excite the sample using the coil surrounding the sample, and detect the NMR signal either directly by the empty coil, or through the cross talk between both tuned circuits. The image shown in FIG. 8D was recorded by connecting the receiver to the filled coil and the transmitter to the empty coil. In this arrangement, the receiver is in an optimal situation to detect an NMR signal, provided that the empty coil can excite the sample. All images were scaled using the same vertical setting. The isolation between coils should be improved by separating both tuned circuits so that they do not share a common ground. Alternatively or in addition, an RF shield may be used between both coils. The RF shield should not impact the performance of either circuit because toroid coils confine the RF field that they generate.

FIGS. 9A, 9B, 9C, and 9D are similar to the illustrated images of FIGS. 8A, 8B, 8C, and 8D after being reprocessed using a nutation frequency squared vertical scaling correction ($F^2$). The vertical scaling correction is applicable for perfect toroid coils; it does not take into account the possibility of cross talk between the coils. The effect on the image of the vertical correction is to amplify the region of high nutation frequencies. This correction is appropriate for toroid coils because sample regions of high nutation frequencies (strong $B_1$ fields) are detected with greater sensitivity (theory of reciprocity). This scaling may be applied to images; it is not clear how it would be applied to a single spectrum. Thus, in an image the scaling reveals a more accurate ratio of signal strength from the coil surrounding the sample and the coil far removed from the sample. The drawback with using the vertical scaling is that it strictly applies for the volume within the toroid coil, and not to sample regions outside the coil. A different vertical scaling should be used for the cross talk signal because two sample volumes are involved, and the toroid coils are not perfect (stray inductance from wires connecting the coils to the capacitors produce $B_1$ fields that are not described by a toroid $B_1$ field). Nonetheless, nutation frequency squared vertical scaling factors ($F^2$) are useful for correcting signal intensities associated with different nutation frequencies. The consequence is better detector selectivity for its contained sample.

FIG. 10 illustrates a further image experiment where a vertical axis was scaled by $F^2$ in the toroid NMR multi-detector 100 of the preferred embodiment. Hexadecane was placed into the bottom loop. $D_2O$ (a spacer liquid) was injected above the hexadecane using a Teflon catheter tube attached to a syringe. Benzene was added above the $D_2O$. Benzene and hexadecane are immiscible with $D_2O$, and the $D_2O$ does not yield a strong proton signal. $H_2O$ was not used in the toroid coils because the dielectric constant is so large that the RF circuit cannot be tuned with the variable capacitor currently used in the RF circuit. Both RF circuits were tuned, but only the coil filled with Benzene yielded a strong Benzene signal. The coil with hexadecane also yielded a strong benzene signal due to the open ends of the toroid coils. In both cases the signal from the hexadecane was weak. We anticipated a much stronger hexadecane signal from the coil surrounding the hexadecane sample. However, the RF detector circuit for the bottom coil may have been detuned by coupling to the top coil or through a common ground loop. This image, however, demonstrated that the coil containing benzene strongly rejected the signal from hexadecane in the adjacent sample loop. The capacitor coupler 700 of FIGS. 7A, 7B, 7C and 7D was designed to address the problem of both radio frequency (RF) circuits coupling to one another in the dual coil probe through a common ground loop.

Figures 11A, 11B, 11C:
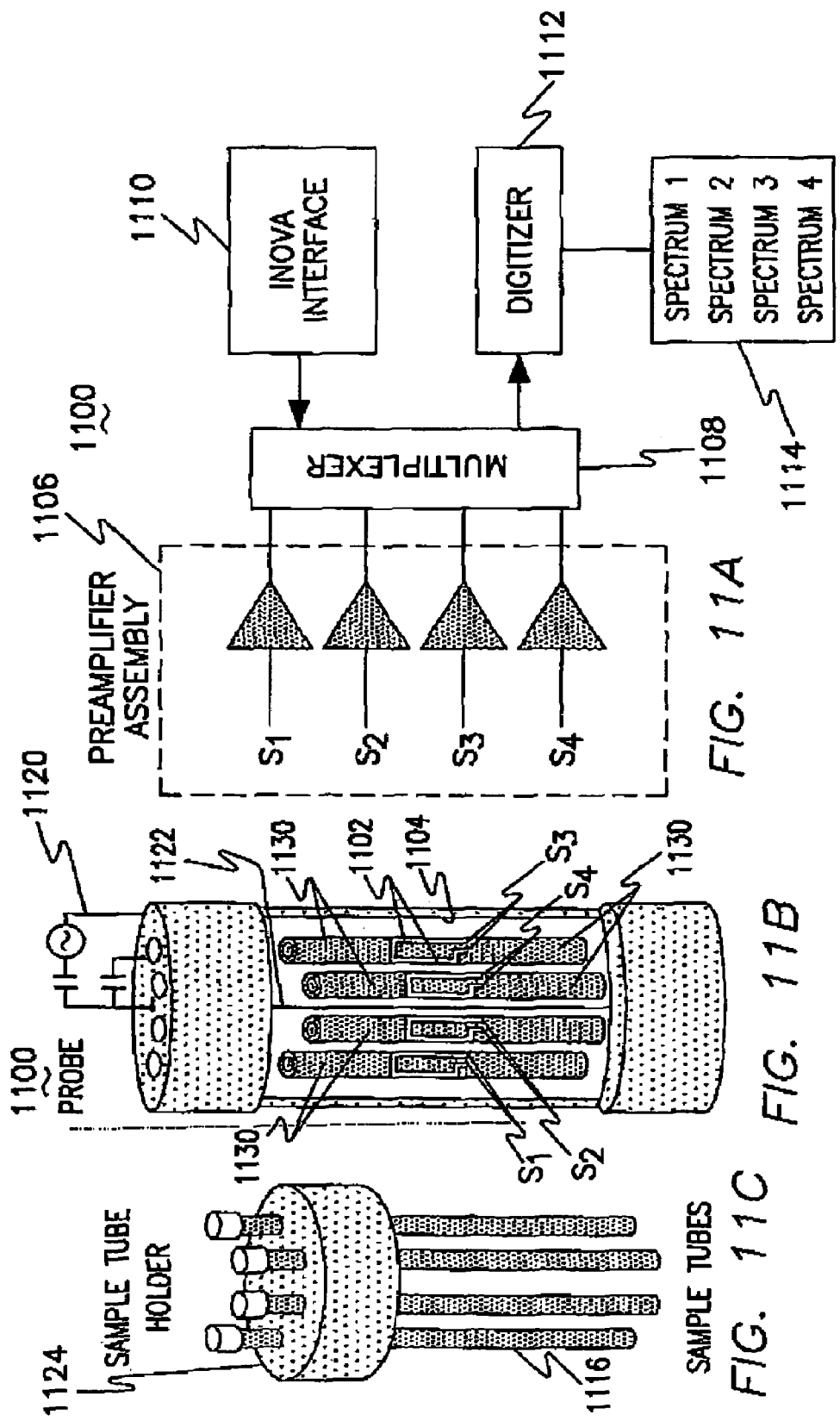
FIGS. 11A, 11B, 11C, 11D, and 11E together provide a schematic and block diagram of an NMR multi-detector including a combination of a plurality of Helmholtz coils in both batch and continuous operation and a toroid cavity of the preferred embodiment.

FIGS. 11A, 11B, 11C, 11D, and 11E illustrate a second embodiment of an NMR multi-detector generally designated by reference character 1100 employing a combination of a plurality of Helmholtz coils 1102 and a toroid cavity 1104, a preamplifier assembly 1106, and a signal multiplexer 1108. An INOVA interface 1110 manufactured by Varian Inc. of Palo Alto, Calif., and a digitizer 1112 are coupled to the signal multiplexer 1108. A spectrum 1-$n$, 1114 or experiment image is generated corresponding to each preamplified signal S1-Sn input to the signal multiplexer 1108. A toroid cavity RF circuit 1120 coupled to a central conductor 1122 is used to simultaneously excite all samples, whereas the individual Helmholtz coils 1102, which are too delicate for the high current of the RF excitation pulse and supported by non-conductive (e.g., glass) tubes 1130, independently detect the weak NMR signals from a corresponding capillary sample tube 1116. The $B_1$ field direction of each Helmholtz coil 1102 is oriented perpendicular to the tangent of the local toroid cavity $B_1$ field to minimize coupling between the Helmholtz and toroid cavity tuned circuits. One very modest limitation of this NMR multi-detector 1100 is that the same NMR experiment must be conducted simultaneously on all samples using this probe. The toroid coil multi-detector NMR probe 100 was designed using completely independent detector circuits, which can be used for excitation and detection, and therefore is not limited to simultaneous and identical experiments for all samples. To aid in efficient sample handling capillary sample tubes 1116 may be held in sample tube holder 1124, as shown in FIG. 11C.

Figure 11D:
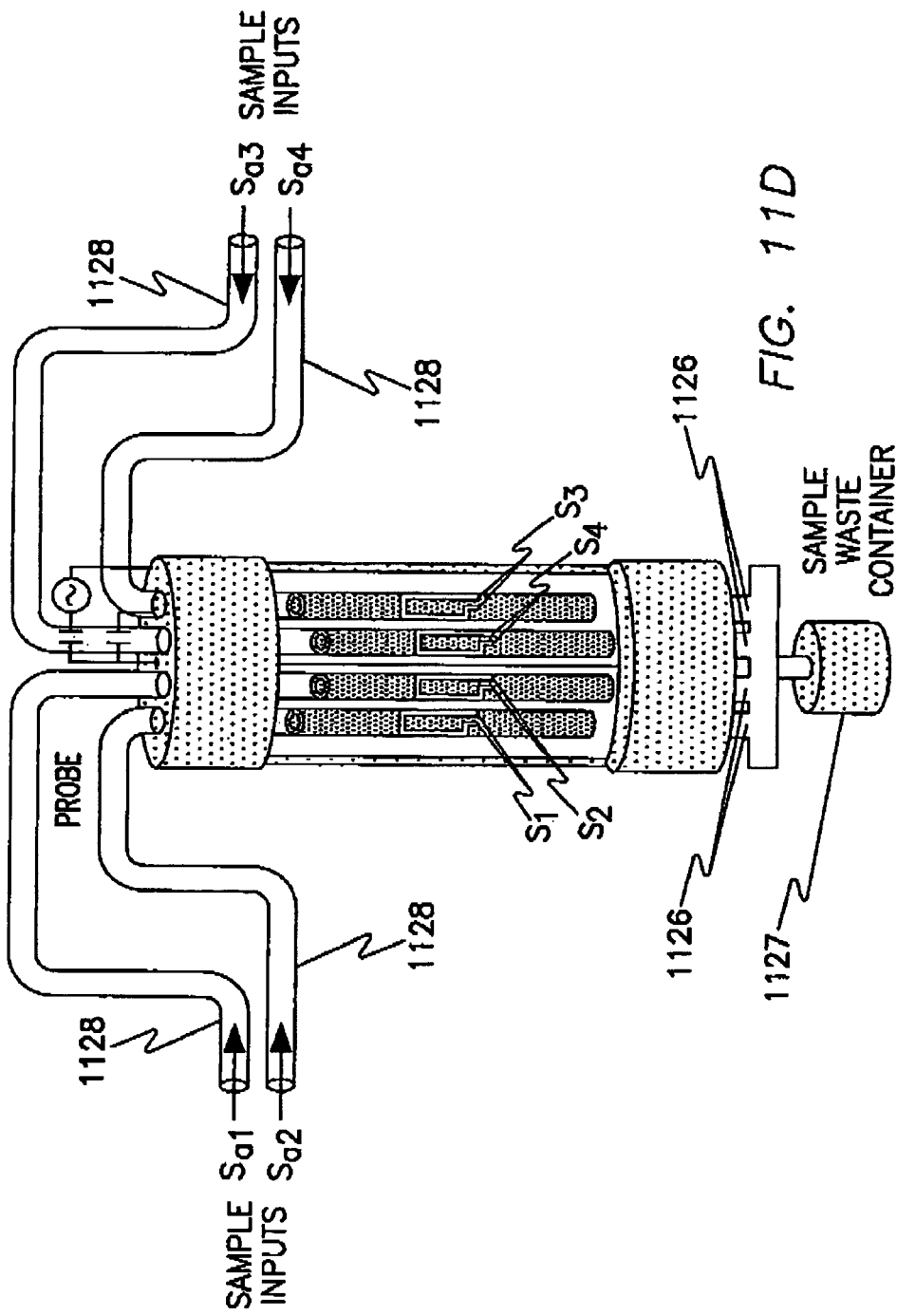

The NMR multi-detector may utilize multiple independent capillary sample tubes 1128 for sample inputs $Sa_1$, $Sa_2$, $Sa_3$, and $Sa_4$, for example, as shown in FIG. 11D. This detector was designed for independent flow through of samples in a parallel mode. A separate capillary tube 1128 passes through each non-conductive (e.g., glass) tube 1130 and is used independently to position a fluid sample in a detector 1102 for analysis. Operation in parallel mode allows exchange of the sample in each detector 1102 independently of insertion and extraction of samples via capillary sample tubes 1128 from the other detectors. After NMR analysis, the samples egress through collection tubes 1126 and are collected in a waste container 1127.

Figure 11E:
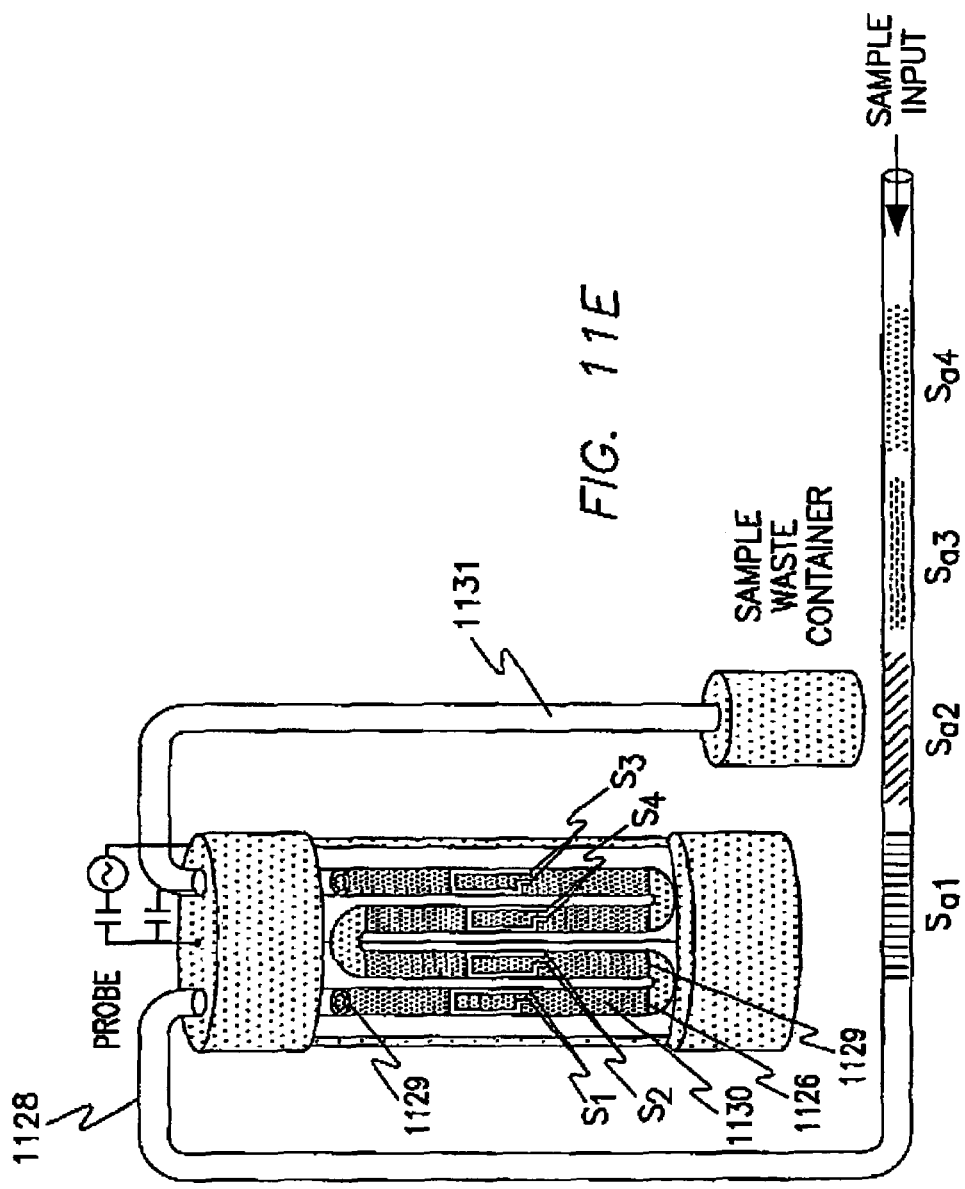

Alternatively, the egress 1126 and ingress 1129 for each capillary sample tube 1130 may be interconnected to provide for continuous sample feed, $Sa_1$, $Sa_2$, $Sa_3$, and $Sa_4$, for example, as shown in FIG. 11E. This detector was designed for flow through of samples in a series mode: A single capillary tube 1128 (or path) passes through each detector in series and is used to position a different fluid sample in each detector 1102 for analysis. Operation in series mode requires an input sequence of fluid sample segments, as shown in FIG. 11E. The exchange of all samples in all detectors occurs simultaneously. After NMR analysis, the samples egress through collection tube 1131 and are collected in a waste container 1127.

In accordance with features of the invention, the second embodiment of the Toroid Cavity/Coil NMR Multi-detector 1100 has been designed, but has not been fabricated, as illustrated and described with respect to FIGS. 111A, 11B, 11C, 11D, and 11E. This toroid cavity detector (TCD) variant includes the toroid cavity 1104 that contains multiple micro Helmholtz coils 1102 arranged on a circular perimeter concentric with the central conductor 1122 of the toroid cavity. An angular orientation of each Helmholtz coil 1102 is adjusted to minimize magnetic field coupling to the TCD. The TCD resonant circuit 1120 and Helmholtz coil resonant circuits are tuned to an identical Larmor frequency for the nuclear spin under test. The high-power handling capability of the TCD circuit 1120 is utilized for simultaneous excitation of all samples located in capillary tubes within the Helmholtz coils that surround the central conductor 1122. Following an RF excitation pulse, the individual micro Helmholtz coils 1102 are used to detect the low-power NMR signals. The individual NMR signals S1, S2, S3, and S4 are amplified and then multiplexed by multiplexer 1108 to the spectrometer receiver 1110. The high-speed digitizer 1112 on the spectrometer is used in the over-sampling mode to sequentially record the NMR signals from the individual Helmholtz coils 1102 such that the discreet voltage measurements of n free induction decays (FIDs) from n detector coils are interleaved. Straightforward manipulation of the interleaved data points results in n independent FIDs, which are subsequently Fourier transformed to n NMR spectra provided at block 1114.

Figures 12A, 12B:
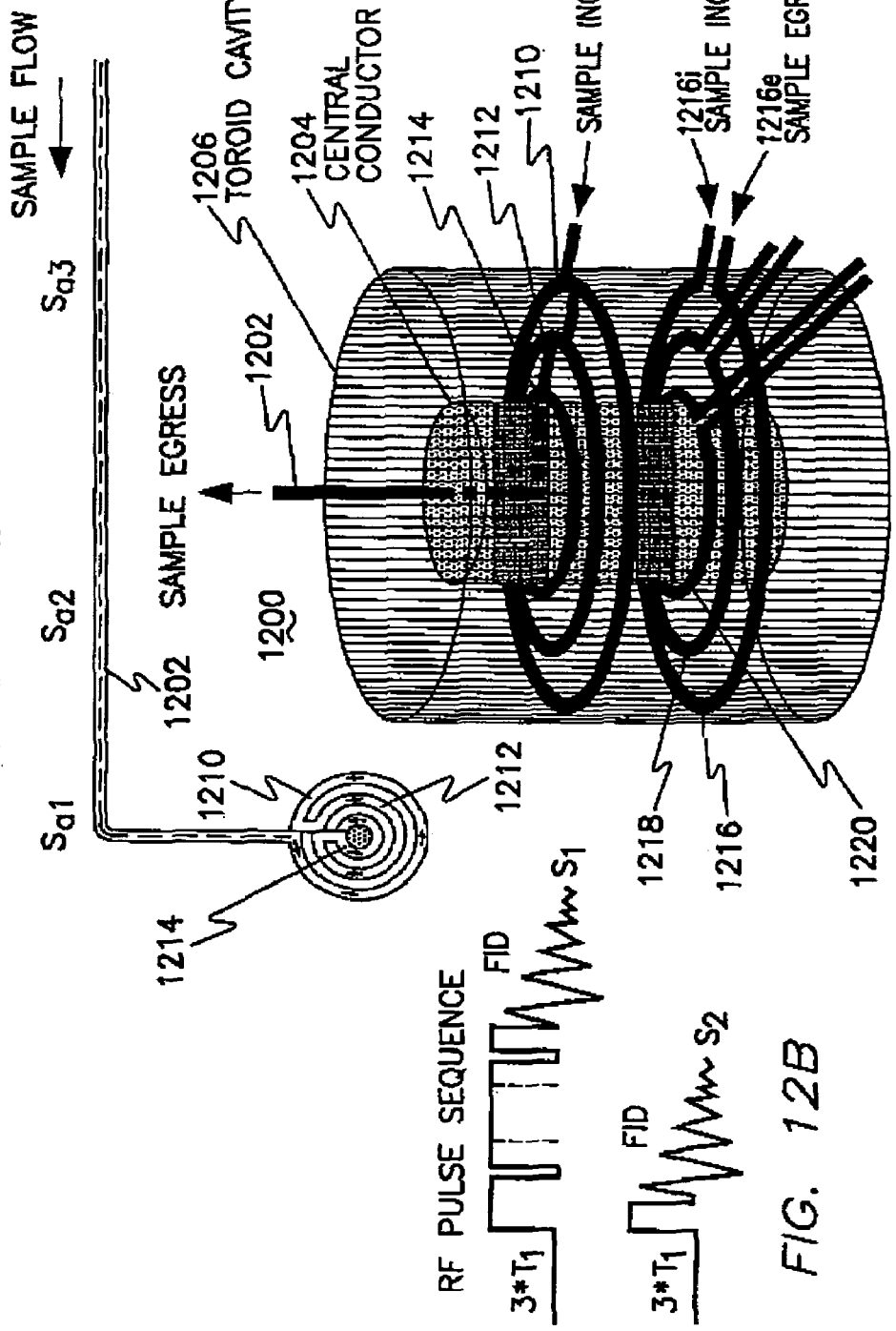
FIGS. 12A and 12B together illustrate a third embodiment of a multi-detector NMR probe based on a toroid detector of the preferred embodiment illustrating concentric sample tubes providing for continuous flow through multiple interconnected concentric rings or concentric rings having independent ingress and egress, and RF pulse sequence for sample interrogation.

FIGS. 12A and 12B illustrate a third embodiment of a multi-detector NMR probe generally designated by reference character 1200 based on a toroid detector of the preferred embodiment. FIG. 12A illustrates a plurality of samples or three samples S1, S2, and S3 within a sample holder 1202 that are provided at different radial positions from a central conductor 1204 within a toroid cavity 1206 shown in FIG. 12A. The sample holder 1202 includes a plurality of concentric sample loops 1210, 1212, and 1214 connected with connector 1215 as shown in FIG. 12A. The radial positions of three samples S1, S2, and S3 are determined such that an NMR signal is obtained selectively from each sample loop by a series of appropriately calibrated RF pulses in a pseudo or partial rotating frame image, for example, employing equal or unequal pulse width increments. Alternatively, a second parallel set of a plurality of sample tubes 1216, 1218, and 1220 may be arranged as shown. This parallel set of tubes would each be provided with separate ingress (i) and egress (e) to eliminate problems associated with sample contamination. In addition parallel sets of tubes provide greater flexibility and capability for sample exchange and analysis. Since discrete annular volumes in radial space contain the samples to be analyzed, a full rotating frame image data set need not be collected. The time savings over conducting NMR experiments on the individual samples in series is approximately realized by the sample loading, locking, and shimming time for three samples vs. one. Considerably more time saving can be had by using the same device, but with an appropriate pulse sequence for selective sample analyses. For example, in a two-loop device, sample 2 will be selectively excited by an RF pulse that rotates its magnetization 90° and the magnetization for sample 1 by 180°; subsequently the NMR signal, i.e., the free induction decay (FID) is collected. Sample 1 is selectively excited by a more complex series of RF pulses: a single pulse first rotates sample 1 magnetization by 360° and simultaneously sample 2 magnetization by 180°. A second composite 90° pulse (sequence) rotates the magnetizations from samples 1 and 2 by 180°. A third single pulse rotates sample 1 magnetization by 180° and simultaneously sample 2 magnetization by 90°. Following the series of three pulses, sample 1 magnetization is positioned at −x and sample 2 magnetization is positioned at +z. After collection of the FID for sample 1, but prior to waiting $3*T_1$ for sample 1, ($T_1$ is the spin-lattice relaxation time constant for the sample) an FID is collected for sample 2 using a single pulse, as described previously. This methodology for sample excitation and data collection for a two-loop toroid cavity detector requires that the radial position for sample 2 vs. sample 1 be in the ratio of 2:1. It is envisioned that the appropriate combination of radial positions for sample loops in a toroid cavity detector and RF pulse sequences will allow any number of samples in separate loops to be analyzed with a substantial time saving. Cross-contamination of sample signals is avoided by positioning the capillary tube used for transporting samples into the side of the toroid cavity detector to minimize the length of tube spanning the radial dimension, and by threading the end of the inner tube loop into a hollow port in the central conductor, then through an exit port at the top of the central conductor. Air gaps between samples $Sa_1$, $Sa_2$, $Sa_3$ . . . , may be used to occupy the short, radially directed sections of capillary tube to prevent the contamination of NMR signals selectively obtained from the sample loops.

A second series of concentric capillary tube loops 1216, 1218, and 1220 is shown positioned below the top loops 1210, 1212, and 1214 to illustrate a second method for positioning samples at three radial positions. This method employs three independent capillary tube loops so that samples can be inserted and removed independently. The sample segment length in the capillary tube should have a length commensurate with the circumference of the corresponding capillary tube loop so that any sample located in the radial regions between capillary tube loops is minimized.

FIGS. 13A and 13B illustrate a fourth embodiment of a multi-detector NMR probe generally designated by reference character 1300 based on a toroid detector of a preferred embodiment. FIG. 13A includes respective locations of three samples $Sa_1$, $Sa_2$, and $Sa_3$ at different radial positions 1210, 1212, and 1214 from the central conductor 1204, as shown in FIG. 12A. In the multi-detector NMR probe 1300, a high current power supply 1302 is connected to the central conductor 1204. As illustrated in FIG. 13A, a second parallel set of a plurality of sample tubes 1216, 1218, 1220 may be arranged as shown. This parallel set of tubes would each be provided with separate ingress (i) and egress (e) to eliminate problems associated with sample contamination. In addition parallel sets of tubes provide greater flexibility and capability for sample exchange and analysis. The radial positions are determined such that an NMR signal is obtained selectively from each sample loop by a series of appropriately calibrated RF pulses as, shown in FIG. 13B, which cause a frequency-selective excitation, executed in combination with the application of a large direct current to the central conductor 1204, which causes magnetic field gradient $G_r$, and $-g_r$. The direct current causes a static radial gradient, $G_r$, and $-g_r$ in the $B_0$ magnetic field, resulting in a frequency shift in the Larmor frequency of the nuclear spins in the sample loops. The greatest frequency shift occurs for the sample loop adjacent to the central conductor 1204. The radial $B_0$ magnetic field gradient is applied just prior to and during, but not after the application of the frequency selective RF pulse, as shown in FIG. 13B, which selectively excites one of the sample loops. A period equal to the time duration of the application of the radial $B_0$ magnetic field gradient is used to apply a much weaker reverse radial $B_0$ magnetic field gradient, $-g_r$, (opposite current direction) to cancel Eddy current effects caused by the first gradient pulse. Immediately following the period of time for the second, reverse $B_0$ magnetic field gradient, the FID is acquired. The time saving over conducting NMR experiments on the individual samples in series is approximately realized by the product of the number of samples and $3*T_1$ ($T_1$ is the average spin-lattice relaxation time constant for the different samples). Suitable radial $B_0$ magnetic field gradient strengths are achieved using direct currents of several hundred amperes flowing through a central conductor several millimeters in diameter. A section of the direct current carrying conductor may also be used as the central conductor 1204 of the toroid cavity detector by employing suitable coupling capacitors. Alternatively, a short metal tube that surrounds and is insulated from the direct current carrying conductor can serve as the central conductor 1204 of the toroid cavity detector 1206.

A second series of concentric capillary tube loops 1216, 1218, and 1220 is shown positioned below the top loops 1210, 1212, and 1214 to illustrate a second method for positioning samples at three radial positions. This method employs three independent capillary tube loops so that samples can be inserted and removed independently. The sample segment length in the capillary tube should have a length commensurate with the circumference of the corresponding capillary tube loop so that any sample located in the radial regions between capillary tube loops is minimized.

Figure 14B:
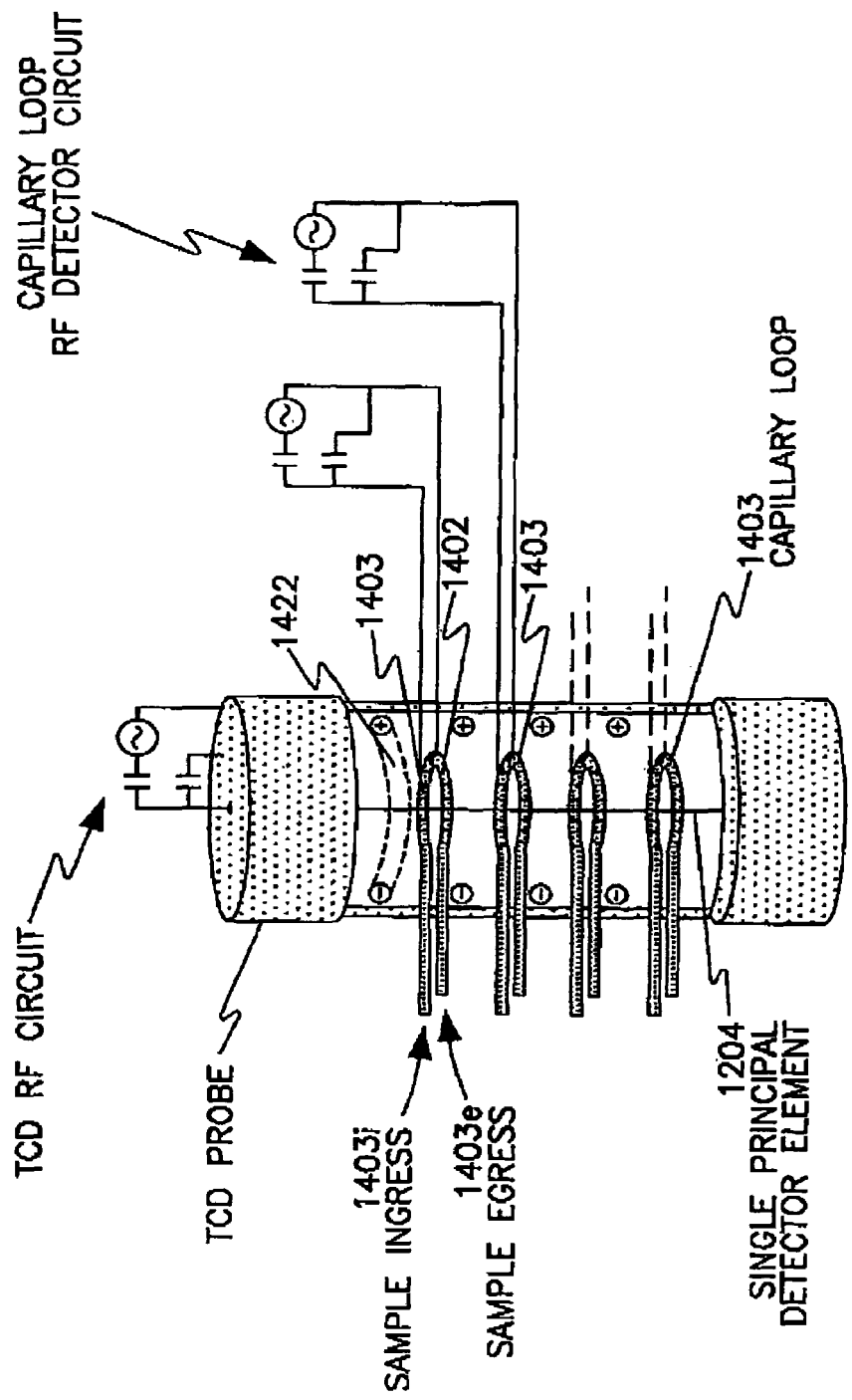

FIGS. 14A, 14B, and 14C illustrate a fifth embodiment of a multi-detector NMR probe generally designated by reference character 1400 based on a toroid detector of the preferred embodiment. Multi-detector NMR probe 1400 uses a plurality of individual toroid coil detectors generally designated 1402 defined by a plurality of loops 1403 formed in a capillary tube 1404 located concentric with the central conductor 1204 of a TCD 1206. For example, up to ten helical turns of a capillary tube 1404 are equipped individually with an associated toroid coil detector 1402 and a radio frequency (RF) detector circuit 1440. The capillary tube 1404 is used to transport a series of sample plugs separated by air gaps to and from the capillary loop array of toroid coil detectors 1402 for analysis. Concentric toroid cavity 1206 and toroid coil detectors 1402 have the correct $B_1$ field symmetry for excitation using the toroid cavity and detection using the toroid coil or vice versa. Using lithographic methods, toroid coils 1402 made of metallic films may be fabricated onto the toroid capillary sample loops 1403. The metallic-film coils 1402 are suitable for detection of the low-power NMR signals, but are too delicate for high-power RF pulses required for sample excitation. Therefore, the central conductor 1204 of the TCD probe is used for simultaneous excitation of all samples. Toroid coils fabricated from metal wire may be used for sample excitation and NMR signal detection. However, the susceptibility mismatch between the wire and the glass will distort the $B_0$ field, resulting in poor spectral resolution. The advantage of metal-film coils is that they may be formed by a lamination process of several materials where the net result is a metallic film that is magnetically transparent, and therefore does not distort the $B_0$ field homogeneity. Because the RF magnetic fields produced by the concentric toroid coils and the toroid cavity share the same symmetry, cross talk between toroid coils is possible, and would result in spectral contamination. This problem is resolved by spoiling the Q (quality factor) of a toroid cavity LC resonance circuit generally designated 1420. Since the toroid cavity is not used to detect NMR signals, deleterious effects will not result from a reduced Q. A magnetic field gradient coil 1422 optionally is provided with the multi-detector NMR probe 1400. An NMR signal is obtained selectively from each sample loop by a series of appropriately calibrated RF pulses (composite or shaped pulse sequence) as shown FIG. 14C, which cause a Larmor frequency-selective excitation, executed in combination with the application of a large direct current to the magnetic field gradient coil. As shown in FIG. 14C, the direct current causes a static axial gradient, $G_z$, or $-g_r$ in the $B_0$ magnetic field, resulting in a frequency shift in the Larmor frequency of the nuclear spins in the axially disposed sample loops. The greatest frequency shift occurs for the sample loops at opposite ends of the central conductor. The axial $B_0$ magnetic field gradient is applied just prior to and during, but not after the application of the frequency selective RF pulse, which selectively excites one of the sample loops. A period equal to the time duration of the application of the axial $B_0$ magnetic field gradient is used to apply a much weaker reverse axial $B_0$ magnetic field gradient, $-g_z$, (opposite current direction) to cancel Eddy current effects caused by the first gradient pulse. Immediately following the period of time for the second, reverse $B_0$ magnetic field gradient, the FID is acquired. The time savings over conducting NMR experiments on the individual samples in series is approximately realized by the product of the number of samples and $3*T_1$ ($T_1$ is the average spin-lattice relaxation time constant for the different samples). Suitable axial $B_0$ magnetic field gradient strengths are achieved using direct currents of several amperes flowing through the magnetic field gradient coil. Actively shielded magnetic field gradient coils are desirable to minimize coupling to the metal structures of the toroid cavity detector. Suitable axial $B_0$ magnetic field gradient strengths are achieved using direct currents of several amperes flowing through the magnetic field gradient coil 1422. Shielded magnetic field gradient coils 1422 are desirable to minimize coupling to the metal structures of the toroid cavity detector. Alternatively, a plurality of parallel sample tube loops 1403 may be arranged as shown in FIG. 14B. This parallel set of tubes would each be provided with separate ingress (i) and egress (e) to eliminate problems with sample contamination. In addition, parallel sets of tubes provide greater flexibility and capability for sample exchange and analysis.

Figure 15:
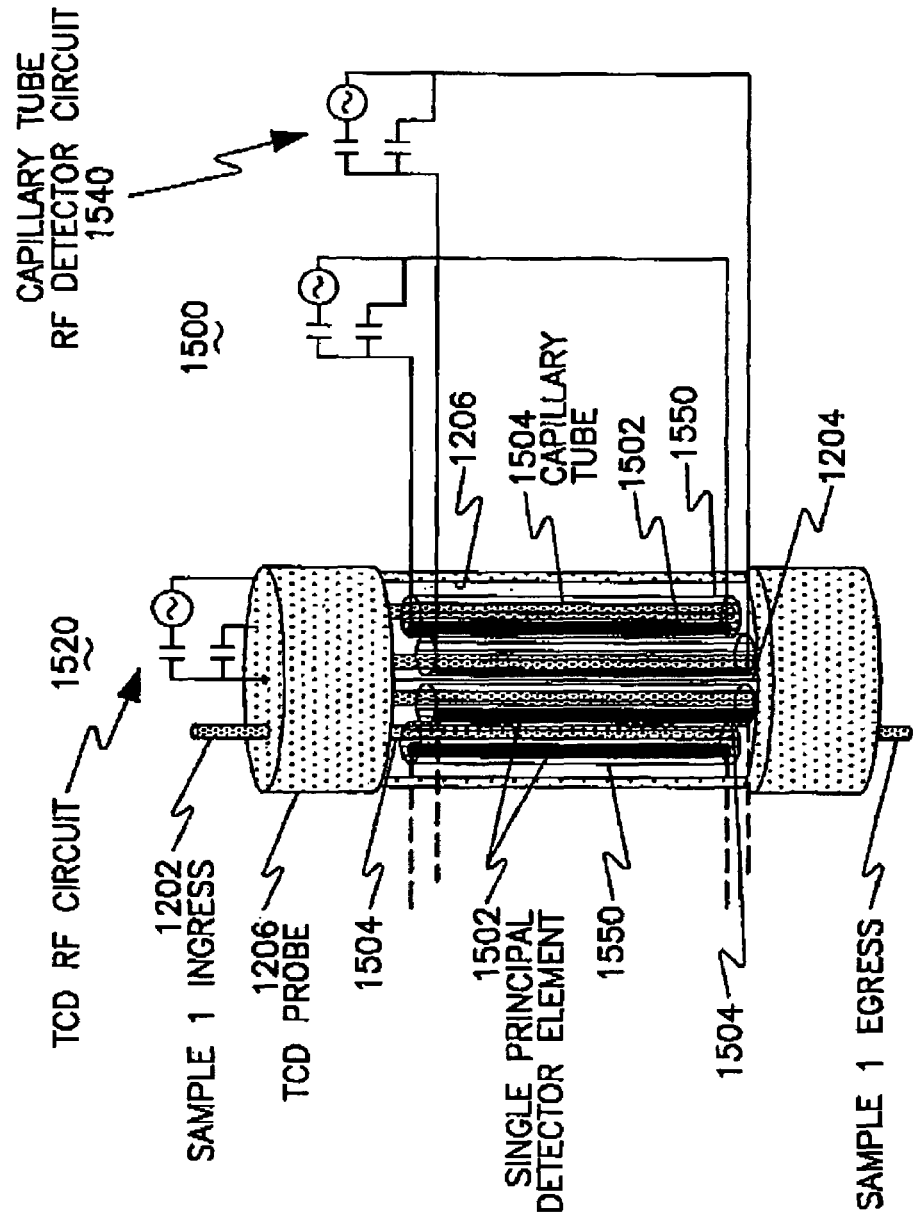
FIG. 15 illustrates a sixth embodiment of a multi-detector NMR probe based on a toroid cavity detector including individual linear conductor principal detector elements and optional conducting tube containing each sample and linear conducting pair located on the perimeter of a circle that is concentric with a central conductor principal detector element of a TCD of the preferred embodiment.

FIG. 15 illustrates a sixth embodiment of a multi-detector NMR probe generally designated by reference character 1500 based on a toroid detector of the preferred embodiment. Multi-detector NMR probe 1500 uses individual linear conductor principal detector elements 1502, each including an associated capillary tube 1504 located on the perimeter of a circle that is concentric with the central conductor principal detector element 1204 of a TCD 1206. A toroid cavity LC resonance circuit is generally designated 1520. A respective radio frequency (RF) detector circuit 1540 is associated with each respective principal detector element 1502. The key advantage to this approach is the reduction of $B_0$ field inhomogeneities due to the vertical arrangement (parallel to $B_0$) of the capillary tubes 1504 and linear principal detector elements. For example, up to ten individual capillary tubes 1504 are equipped individually with a single linear conductor principal detector element 1502. Each capillary tube 1504 is used to transport a sample to and from a single linear conductor principal detector element 1502 for analysis. The linear conductor principal detector element 1502 can be placed next to the sample capillary tube 1504, or within the sample capillary tube.

An electrically conductive tube 1550 optionally is provided that contains a respective sample capillary tube 1504 and principal detector element 1502. Each of the optional conductive tubes 1550 provides a conductive shield, minimizing cross talk between detector elements 1502. When used, the conductive tubes 1550 and the capillary tube RF detector circuits 1540 can be used to excite the respective samples within each respective sample capillary tube 1504. Then the TCD RF circuit 1520 is not required for sample excitation and can be used for other functions, for example, decoupling or magnetic field locking.

It should be understood that the capillary tubes 1504 may be replaced by a single continuous capillary tube used to transport a series of spaced samples to the locations of the individual detectors. Linear principal detector elements 1502 used exclusively for NMR signal detection, where the TCD central conductor 1204 is used for sample excitation, may be fabricated directly onto the glass capillary tube 1504 by lithographic methods. Free standing linear principal detector elements 1502 have the advantage that they also may be used for sample excitation, such as with high current RF pulses, as well as NMR signal detection, and may be fabricated from high-purity copper wire.

While the present invention has been described with reference to the details of the embodiments of the invention shown in the drawing, these details are not intended to limit the scope of the invention as claimed in the appended claims.

We claim:

1. An analytical device configured for non-invasive nuclear magnetic resonance (NMR) spectroscopy of multiple samples comprising:

at least one continuous sample container tube containing at least one sample for analysis, said continuous sample tube forming at least one sample container tube loop section and having associated transport sections, each of said at least one sample container tube loops having a sample inlet end and a sample exit end wherein the sample inlet end and the sample exit end of each of the at least one sample container tube loops are bent back towards one another in order to bring both inlet and exit ends into close proximity to one another;

a separate conductor element wrapped around the loop section of the at least one of said sample container tube loops, for each of the sample container tube loops present which are contained within the at least one continuous sample container tube, said conductor alternately generating a RF magnetic field configured for NMR interrogation and reception of an NMR signal from a sample; and a multiplexer coupled to at least one of each of said one or more conductor elements receiving said NMR signals from said one or more conductor elements.

2. The analytical device as recited in claim 1 wherein said at least one sample container tube loops are formed from said sample container tube wherein both ends of said sample container tube loops for at least one of said sample container tube loops are brought into coincidence wherein said one or more conductor elements form a toroid coil for at least one of said sample container tube loops.

3. The analytical device as recited in claim 1 wherein a plurality of said sample tube container loops are connected in series with the at least one continuous sample container tube.

* * * * *